United States Patent
Kim et al.

(10) Patent No.: US 7,709,857 B2
(45) Date of Patent: May 4, 2010

(54) LIGHT EMITTING DIODE PACKAGE

(75) Inventors: Kyung Tae Kim, Gyeonggi-do (KR); Bong Girl Min, Gyeonggi-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 0 days.

(21) Appl. No.: 12/149,008

(22) Filed: Apr. 24, 2008

(65) Prior Publication Data

US 2008/0277685 A1 Nov. 13, 2008

(30) Foreign Application Priority Data

Apr. 24, 2007 (KR) ...................... 10-2007-0039777

(51) Int. Cl.
*H01L 33/00* (2010.01)
(52) U.S. Cl. .................. 257/100; 257/99; 257/690; 257/788; 257/E33.057; 257/E33.058; 438/106; 438/123; 438/124
(58) Field of Classification Search .................. 257/99, 257/100, 690, 788, E33.057, 692, 693, 696, 257/776, 737, 758, 778, 95, 738, 784, 787, 257/E23.048, E23.059, E23.14, E23.079, 257/E25.032, E21.502, E21.504, E21.505; 438/106, 121–126, 25, 26, 118, 119, 107, 438/113
See application file for complete search history.

(56) References Cited

U.S. PATENT DOCUMENTS 6,858,879 B2 * 2/2005 Waitl et al. ..................... 257/99
2006/0043401 A1 * 3/2006 Lee et al. ...................... 257/99

FOREIGN PATENT DOCUMENTS

KR 10-2007-0000638 A 1/2007

OTHER PUBLICATIONS

Korean Office action issued in Patent Application No. 10-2007-0039777 dated on Aug. 12, 2008.

* cited by examiner

*Primary Examiner*—Sue Purvis
*Assistant Examiner*—Whitney Moore
(74) *Attorney, Agent, or Firm*—McDermott Will & Emery LLP

(57) ABSTRACT

Provided is a light emitting diode package in accordance with the present invention including a lead frame composed of at least a pair of lead terminals; a mold receiving a part of the lead frame therein and equipped with an irradiation window opened to radiate light, and further including one or more holes formed to expose a part of a bottom surface of the lead frame received in the inside of the mold; an LED chip mounted on the lead frame positioned in the mold; an electrode connection unit for electrically connecting the LED chip and the lead frame; and a molding agent composed of any one selected from transparent epoxy, silicon, and phosphor blends charged in the mold and protecting the LED chip.

10 Claims, 2 Drawing Sheets

[FIG. 1]
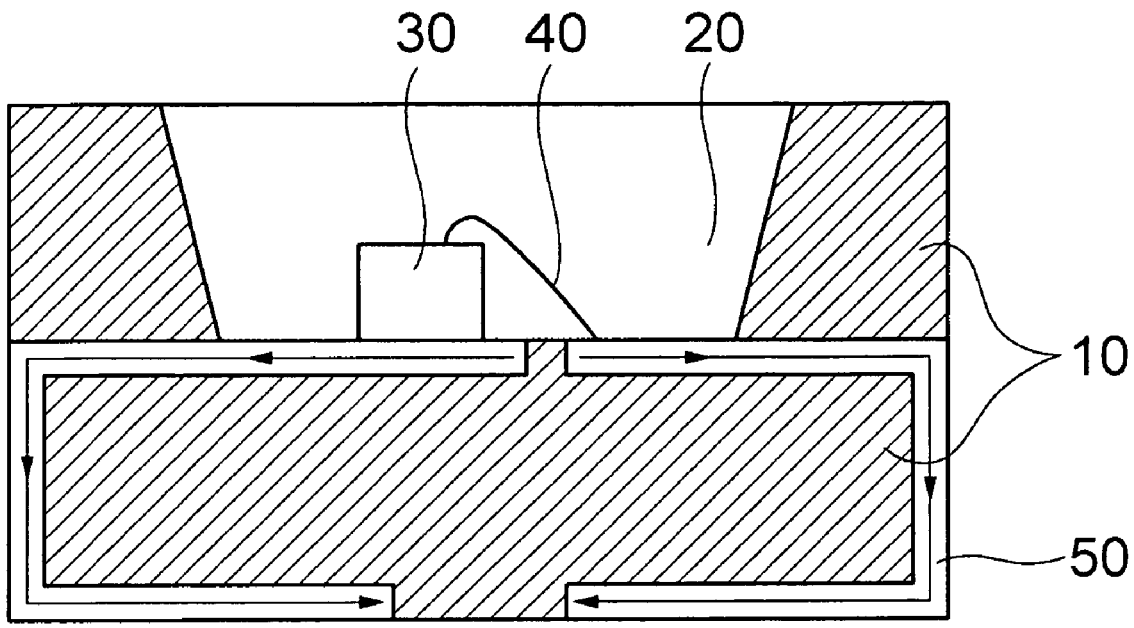
- Prior Art -
[FIG. 2]
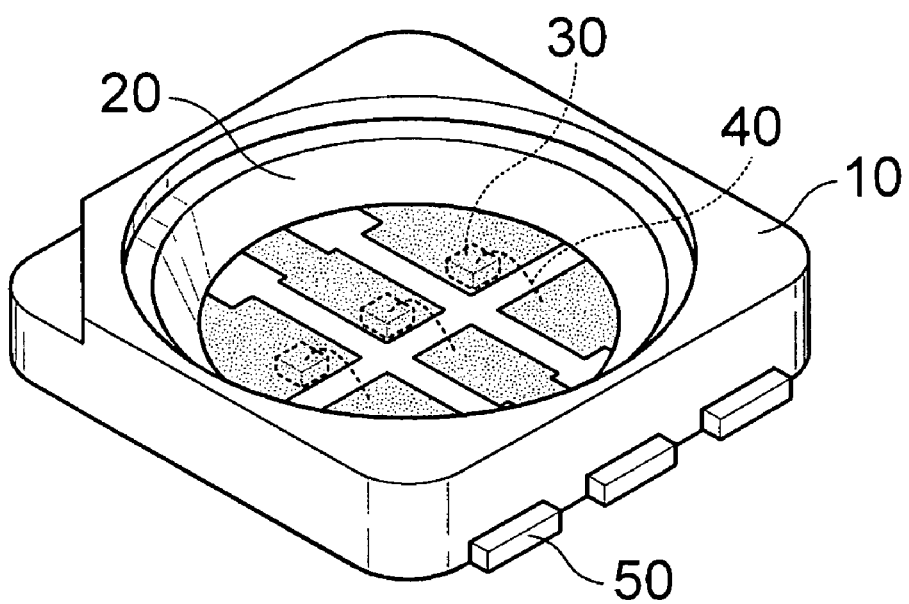

[FIG. 3]
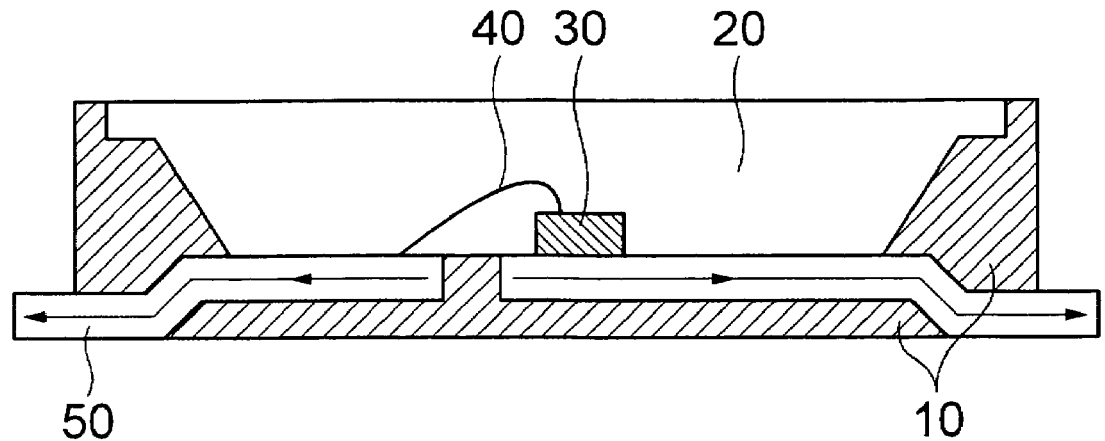
[FIG. 4]
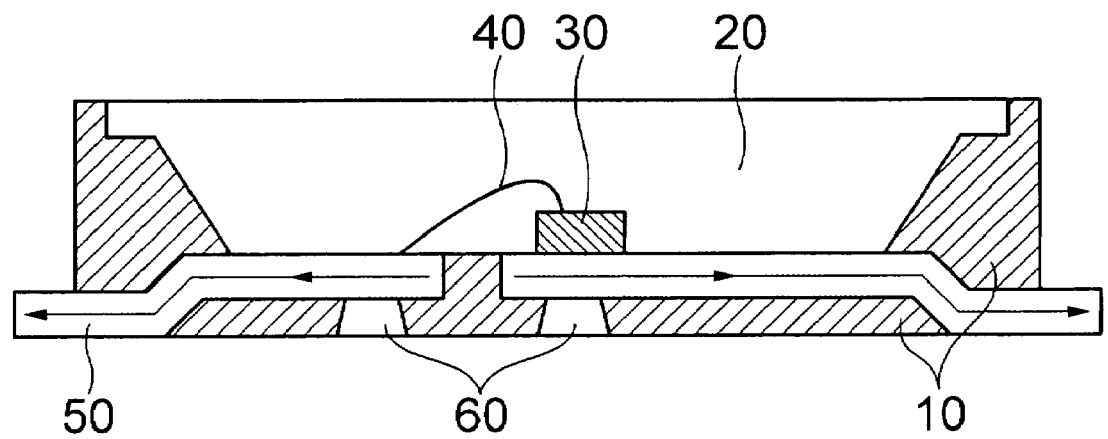
[FIG. 5]
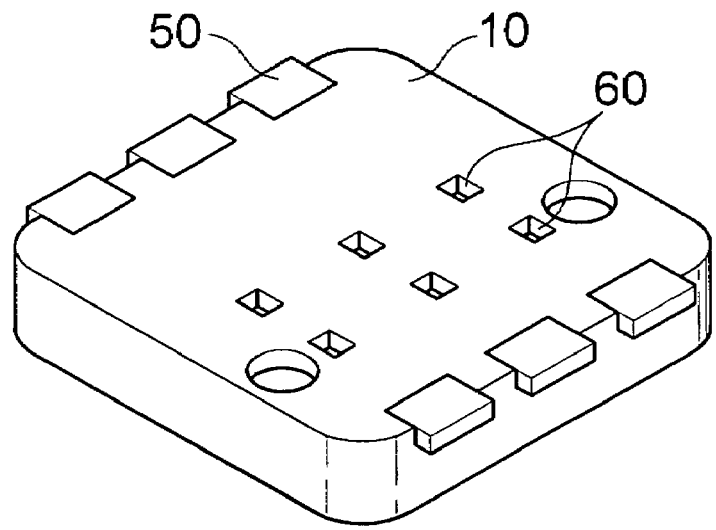

_US 7,709,857 B2_

LIGHT EMITTING DIODE PACKAGE

CROSS-REFERENCE TO RELATED APPLICATIONS

This application claims the benefit of Korean Patent Application No. 10-2007-0039777 filed with the Korea Intellectual Property Office on Apr. 24, 2007, the disclosure of which is incorporated herein by reference.

BACKGROUND OF THE INVENTION

1. Field of the Invention

The present invention relates to a light emitting diode package; and more particularly, to a surface mounting type light emitting diode package having an excellent heat radiation characteristic.

2. Description of the Related Art

In general, a light emitting diode (hereinafter, referred to as 'LED') is an electronic component generates a minority of carriers (electrons or holes) injected by using a p-n junction structure of a semiconductor and emits light by the recombination of the carriers. That is, when the electrons and holes are recombined with each other with moving through a junction portion of an anode and a cathode at the time of applying a forward voltage to a semiconductor of a predetermined element, the energy of the recombined electrons and holes is smaller than energy generated when the electrons and the holes are separated from each other. Therefore, light is emitted by a difference in energy at this time.

Since such light emitting diode can emit high-efficiency light at a low voltage, the light emitting diode is used in a home electronic appliance, a remote controller, a signboard, a display, various automated machines, and the like.

In particular, various components of telecommunication apparatuses, such as a resistor, a condenser, a noise filter, and the like are further miniaturized with the miniaturization and slimness of telecommunication apparatuses. The light emitting diode is also fabricated in a surface mount device (hereinafter, referred to as 'SMD') type to be mounted directly on a light emitting diode PCB (Printed Circuit Board).

The SMD-type light emitting diode package is fabricated by a top view method and a side view method according to the usage of the SMD-type light emitting diode package. Recently, the SMD-type light emitting diode package is inactivated to heat due to the miniaturization and slimness.

Hereinafter, a conventional light emitting diode package will be described in detail with respect to FIG. 1.

FIG. 1 is a schematic view illustrating a structure of a conventional surface mounting-type LED package.

Referring to FIG. 1, the conventional lighting emitting diode package includes a lead frame 50 composed of a pair of lead terminals, a mold 10 made of a synthetic resin material to receive a part of the lead frame 50 in the inside thereof, an LED chip 30 mounted on the lead frame 50 positioned in the mold, an electrode connection unit 40 for electrically connecting the lead frame 50, and a molding agent 20 for protecting the LED chip 30 and the electrode connection unit 40.

An irradiation window opened to easily radiate light is formed on a predetermined surface of the mold 10 and the lead frame 50 composed of the pair of lead frames is formed on the other surface to be mounted on a printed circuit board (not shown). At this time, the lead frame 50 covers an outside, that is, parts of a side surface and a bottom surface of the mold 10.

Accordingly, the LED chip 30 is mounted on the lead frame 50 composed of the pair of lead terminals and thus most of heat discharged from the LED chip 30 is discharged through the lead frame 50 connected to the LED chip 30.

However, the conventional lead frame 50 is bent to cover the parts of the side surface and the bottom surface of the mold 10 through an additional bending process so as to be electrically connected to the printed circuit board to be mounted on a surface corresponding to the irradiation window of the mold 10, that is, the bottom surface of the mold 10.

However, when the lead frame covers the parts of the side surface and the bottom surface of the mold, an overall length of the lead frame is increased and thus heat conductivity is lowered, whereby the quantity of heat irradiatable through the lead frame also decreases.

When the quantity of the heat irradiatable through the lead frame decreases, the lead terminal mounted with the LED chips is overcome by the heat to be black colored or the bonding of a wire for electrically connecting the LED chips to the lead frame.

Accordingly, the characteristic and reliability of the light emitting diode package are lowered and light efficiency is also lowered due to the discoloration of the lead terminal.

SUMMARY OF THE INVENTION

In order to solve the above-mentioned problems, an advantage of the present invention is that it provides a light emitting diode package which can improve a heat irradiation characteristic of heat generated in LED chips through a lead frame by decreasing an overall length of the lead frame mounted with the LED chips to increase the heat conductivity of the lead frame.

In order to achieve the above-mentioned advantage of the invention, in accordance with an embodiment of the present invention, there is provided a light emitting diode package including a lead frame composed of at least a pair of lead terminals; a mold receiving a part of the lead frame therein and equipped with an irradiation window opened to radiate light, and further including one or more holes formed to expose a part of a bottom surface of the lead frame received in the inside of the mold; an LED chip mounted on the lead frame positioned in the mold; an electrode connection unit for electrically connecting the LED chip and the lead frame; and a molding agent composed of any one selected from transparent epoxy, silicon, and phosphor blends charged in the mold and protecting the LED chip.

In the light emitting diode package in accordance with the embodiment of the invention, the holes are preferably charged with any one selected from a group composed of copper, silver, aluminum, or an alloy including one or more of the copper, silver, and aluminum.

In the light emitting diode package in accordance with the embodiment of the invention, the electrode connection unit is preferably composed of a wire or a conductive adhesive. The conductive adhesive is preferably made of silver (Ag) having high heat conductivity.

In order to achieve the above-mentioned advantages, in accordance with another embodiment of the invention, a light emitting diode package including a lead frame composed of at least a pair of lead terminals; a mold receiving a part of the lead frame therein and equipped with an irradiation window opened to radiate light, and further including one or more holes formed to expose a part of a bottom surface of the lead frame received in the inside of the mold; an LED chip mounted on the lead frame positioned in the mold; an electrode connection unit for electrically connecting the LED chip and the lead frame; and a molding agent composed of any one selected from transparent epoxy, silicon, and phosphor blends charged in the mold and protecting the LED chip, wherein the lead frame received in the mold is bent in the inside of the mold so that the bottom surface of the lead frame received in the end of the mold is exposed to the outside of the bottom surface of the mold.

Herein, a printed circuit board is preferably mounted on the bottom surface of the lead frame exposed to the outside in the end of the mold.

The hole is preferably charged with any one selected from any one selected from a group composed of copper, silver, aluminum, or an alloy including one or more of the copper, silver, and aluminum.

The electrode connection unit is preferably composed of a wire or a conductive adhesive. The conductive adhesive is made of silver (Ag) having high heat conductivity.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 1 is a schematic view illustrating a structure of a conventional surface mounting type LED package;

FIG. 2 is a perspective view illustrating a structure of a surface mounting type LED package in accordance with an aspect of the present invention;

FIG. 3 is a cross-sectional view of the surface mounting type LED package taken along a line III-III' shown in FIG. 2;

FIG. 4 is a cross-sectional view illustrating a modified example of the surface mounting type LED package in accordance with the aspect of the present invention; and FIG. 5 is a bottom view illustrating the structure of the surface mounting type LED package shown in FIG. 4.

DETAILED DESCRIPTION OF THE PREFERRED EMBODIMENTS

Hereinafter, embodiments of the present invention will be described in detail with respect to the accompanying drawings in order to enable those skilled in the art to make and use the invention.

In the drawings, several layers and areas are definitely shown by enlarging thicknesses of layers and areas. Like reference numerals refer to like elements throughout.

Hereinafter, a light emitting diode package in accordance with an embodiment of the invention will be described in detail with respect to FIGS. 2 and 3.

FIG. 2 is a perspective view illustrating a structure of the surface mounting type LED package in accordance with the embodiment of the invention; and FIG. 3 is a cross-sectional view of the surface mounting type LED package taken along a line III-III' shown in FIG. 2.

As shown in FIGS. 2 and 3, the light emitting diode package in accordance with the embodiment of the invention includes a mold 10 having a cavity formed in a center thereof. An irradiation window opened so radiate light is formed on a predetermined surface of the mold 10 and a lead frame 50 composed of at least a pair of lead terminals is formed on the other surface of the mold 10 so be mounted on a printed circuit board (not shown).

More specifically, a part of the lead frame 50 in accordance with the invention is received in the inside of the mold 10 and a bottom surface of the lead frame 50 positioned on an end of the mold 10 among the lead frame 50 received in the inside of the mold 10 is bent in the inside of the mold 10 to be exposed to the outside through the bottom surface of the mold 10.

That is to say, in the present invention, contrary to a lead frame (refer to a reference numeral 50 of FIG. 1) of a conventional light emitting diode package formed to cover an outside, that is, parts of a side surface and a bottom surface of the mold 10 so as to improve the heat radiation characteristic of heat discharged from LED chips 30 mounted on the lead frame 50, the heat conductivity of the lead frame can be improved making the lead frame in accordance with the invention shorter than the lead frame of the conventional light emitting diode device by exposing the part of the lead frame 50 received in the inside of the mold 10 to the outside through the bottom surface of the mold 10. Therefore, the light emitting diode package in accordance with the invention can maximize the quantity of the heat irradiatable through the lead frame compared to the conventional light emitting diode package. Hence, the light emitting diode package in accordance with the present invention can maximize the quantity of heat generated in the LED chips through the lead frame compared to the conventional light emitting diode package, whereby acquiring an irradiation effect more excellent than the conventional light emitting diode package.

It is possible to more definitely know that a length of the lead frame in accordance with the present invention is shorter than a length of the lead frame of the conventional light emitting diode package by comparing an arrow of FIG. 1 indicating the conventional light emitting diode package with an arrow of FIG. 3 indicating the light emitting diode package in accordance with the embodiment of the invention.

It is possible to make the light emitting diode device more slim by mounting the printed circuit board on the exposed bottom surface the lead frame 50 after exposing the bottom surface of the lead frame 50 positioned on the end of the mold 10 among the lead frame 50 received in the inside of the mold 10 through the bottom surface of an end of the mold 10.

The LED chips 30 are provided in the inside of the above-configured mold 10 so that Light emitting surfaces of the LED chips 30 face the irradiation window of the mold 10. The lead frame 50 and the LED chips 30 are electrically connected to each other by an electrode connection unit 40.

At this time, the electrode connection unit 40, as a connecting member for electrically connecting the LED chips 30 and the lead frame 50 to each other, may be composed of a wire or a conductive adhesive according to device characteristics and process conditions.

In particular, since the conductive adhesive can electrically connect the LED chips 30 to the lead frame 50 without an additional connection wire as well as fix the LED chips 30 to the lead frame 50 more stably than the wire, there is an advantage that it is possible to prevent the light emitting surface of the light emitting diode package is lost due to the additional connection wire.

The conductive adhesive is preferably made of a conductive material having high heat conductivity, for example, a material such as silver (Ag) so as to improve the heat irradiation characteristic of the heat generated in the LED chips 30.

A molding agent 20 for protecting the LED chips 30 and the electrode connection unit 40 is charged in the mold mounted with the LED chips 30. Herein, the molding agent 20 is made of any one of transparent epoxy, silicon, and phosphor blends so as to transmit light emitted from the LED chip 30 mounted on the mold 10 to the outside. The molding agent 20 serves to a part of the heat generated in the LED chips 30, that is, heat other than the heat irradiated through the lead frame 50.

Referring to FIGS. 4 and 5, a modified example of the light emitting diode package in accordance with the embodiment of the invention will be hereinafter described. However, description of the same constituent members of the modified example as the above-mentioned embodiment will be omitted and only constituent members in the modified example other than those in the embodiment will be described in detail.

FIG. 4 is a cross-sectional view illustrating the modified example of the surface mounting type LED package in accordance with the embodiment of the invention; and FIG. 5 is a bottom view illustrating a structure of the surface mounting type LED package shown in FIG. 4.

As shown in FIGS. 4 and 5, most of the constituent members of the light emitting diode package in accordance with the modified example are the same as those of the light emitting diode package in accordance with the embodiment of the invention. However, the light emitting diode package in accordance with the modified example is different from the light emitting diode package in accordance with the embodiment of the invention only in that at least one holes 60 for exposing the part of the lead frame 50 received in the inside of the mold 10 is provided on the bottom surface of the mold 10.

That is to say, the only shortened lead frame 50 is illustrated as a discharge path of the heat generated in the LED chips 30 in the embodiment of the invention, while the hole 60 for exposing the part of the lead frame 50 received in the inside of the mold 10, which is formed on the bottom surface of the mold 10, is illustrated as another discharge path of the heat generated in the LED chips 30.

Meanwhile, FIGS. 4 and 5 illustrate a state that the hole 60 is charged with air, but the hole 60 is not limited to it and the hole 60 may be charged with the material having the high heat conductivity, for example, a material such as copper, silver, aluminum, or an alloy containing at least one of the copper, silver, and aluminum.

As described above, in the present invention, the heat irradiation characteristic of the heat generated in the LED chips is improved by minimizing the length of the lead frame mounted with the LED chips to improve the heat conductivity of the lead frame. Accordingly, the characteristic and reliability of the light emitting diode package can be improved by preventing the lead frame from being discolored or debonded.

In the present invention, it is possible to make the light emitting diode package more slim by mounting the printed circuit board on the exposed lead frame after exposing the part of the lead frame received in the inside of the mold to the outside through the bottom surface of the mold.

Although preferred embodiments of the present invention have been described in detail, it will be appreciated by those skilled in the art that various changes and modifications may be made in these embodiments without departing from the principles and spirit of the general inventive concept, the scope of which is defined in the appended claims and their equivalents.

What is claimed is:

1. A light emitting diode package comprising:
   a lead frame composed of at least a pair of lead terminals;
   a mold receiving a part of the lead frame therein and equipped with an irradiation window opened to radiate light, and further including one or more holes formed to expose a part of a bottom surface of the lead frame received in the inside of the mold;
   an LED chip mounted on the lead frame positioned in the mold;
   an electrode connection unit for electrically connecting the LED chip and the lead frame; and
   a molding agent composed of any one selected from transparent epoxy, silicon, and phosphor blends charged in the mold and protecting the LED chip,
   wherein the holes is charged with air.

2. A light emitting diode package comprising:
   a lead frame composed of at least a pair of lead terminals;
   a mold receiving a part of the lead frame therein and equipped with an irradiation window opened to radiate light, and further including one or more holes formed to expose a part of a bottom surface of the lead frame received in the inside of the mold;
   an LED chip mounted on the lead frame positioned in the mold;
   an electrode connection unit for electrically connecting the LED chip and the lead frame; and
   a molding agent composed of any one selected from transparent epoxy, silicon, and phosphor blends charged in the mold and protecting the LED chip,
   wherein the holes are charged with any one selected from a group composed of copper, silver, aluminum, or an alloy including one or more of the copper, silver, and aluminum.

3. The light emitting diode package as recited in claim 1 or 2, wherein the electrode connection unit is composed of a wire or a conductive adhesive.

4. The light emitting diode package as recited in claim 3, wherein the conductive adhesive is made of silver (Ag) including high heat conductivity.

5. A light emitting diode package comprising:
   a lead frame composed of at least a pair of lead terminals;
   a mold receiving a part of the lead frame therein and equipped with an irradiation window opened to radiate light, and further including one or more holes formed to expose a part of a bottom surface of the lead frame received in the inside of the mold;
   an LED chip mounted on the lead frame positioned in the mold;
   an electrode connection unit for electrically connecting the LED chip and the lead frame; and
   a molding agent composed of any one selected from transparent epoxy, silicon, and phosphor blends charged in the mold and protecting the LED chip,
   wherein the lead frame received in the mold is bent in the inside of the mold so that the bottom surface of the lead frame received in the end of the mold is exposed to the outside of the bottom surface of the mold.

6. The light emitting diode package as recited in claim 5, wherein a printed circuit board is mounted on the bottom surface of the lead frame exposed to the outside in the end of the mold.

7. The light emitting diode package as recited in claim 5, wherein the hole is charged with air.

8. The light emitting diode package as recited in claim 5, wherein the hole is charged with any one selected from any one selected from a group composed of copper, silver, aluminum, or an alloy including one or more of the copper, silver, and aluminum.

9. The light emitting diode package as recited in claim 5, wherein the electrode connection unit is composed of a wire or a conductive adhesive.

10. The light emitting diode package as recited in claim 9, wherein the conductive adhesive is made of silver (Ag) having high heat conductivity.

* * * * *